(12) United States Patent
Narazaki et al.

(10) Patent No.: US 6,202,883 B1
(45) Date of Patent: *Mar. 20, 2001

(54) TRAY FOR SEMICONDUCTOR INTEGRATED CIRCUIT DEVICES

(75) Inventors: Norio Narazaki; Yutaka Shiraishi; Osamu Kakinoki, all of Hiratsuka (JP)

(73) Assignee: Mitsubishi Engineering-Plastics Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/238,613

(22) Filed: Jan. 28, 1999

(30) Foreign Application Priority Data

Feb. 6, 1998 (JP) .................................................. 10-025271

(51) Int. Cl.⁷ ....................................................... B65D 1/36
(52) U.S. Cl. ........................... 220/507; 206/706; 206/725
(58) Field of Search ..................................... 206/706, 725, 206/722, 564; 220/507, 553, 555

(56) References Cited

U.S. PATENT DOCUMENTS

| 1,545,487 | * | 7/1925 | Croft | 206/564 |
| 4,425,997 | * | 1/1984 | Grant | 206/0.84 |
| 4,648,524 | * | 3/1987 | Ackermann | 220/507 |
| 5,103,976 | * | 4/1992 | Murphy | 206/719 |
| 5,957,293 | * | 9/1999 | Pakeriasamy | 206/725 |

FOREIGN PATENT DOCUMENTS

| 2-232944 | 9/1990 | (JP) . |
| 3-43383 | 2/1991 | (JP) . |

* cited by examiner

Primary Examiner—Stephen Castellano
(74) Attorney, Agent, or Firm—Wenderoth, Lind & Ponack, L.L.P.

(57) ABSTRACT

A tray for semiconductor integrated circuit devices, including a plurality of first partition walls extending in a first direction, a plurality of second partition walls extending in a second direction at right angles with the first direction, and circumferential frame portions connecting end portions of the first and second partition walls. The regions surrounded by the first partition walls and the second partition walls constitute seating portions for seating semiconductor integrated circuit devices. The first partition walls are disposed such that one first partition wall is disposed between two rows of the seating portions which are adjacent to each other in the second direction. The second partition walls are disposed such that two second partition walls are disposed between two rows of the seating portions which are adjacent to each other in the first direction, and opening portions are formed between the two second partition walls.

10 Claims, 11 Drawing Sheets

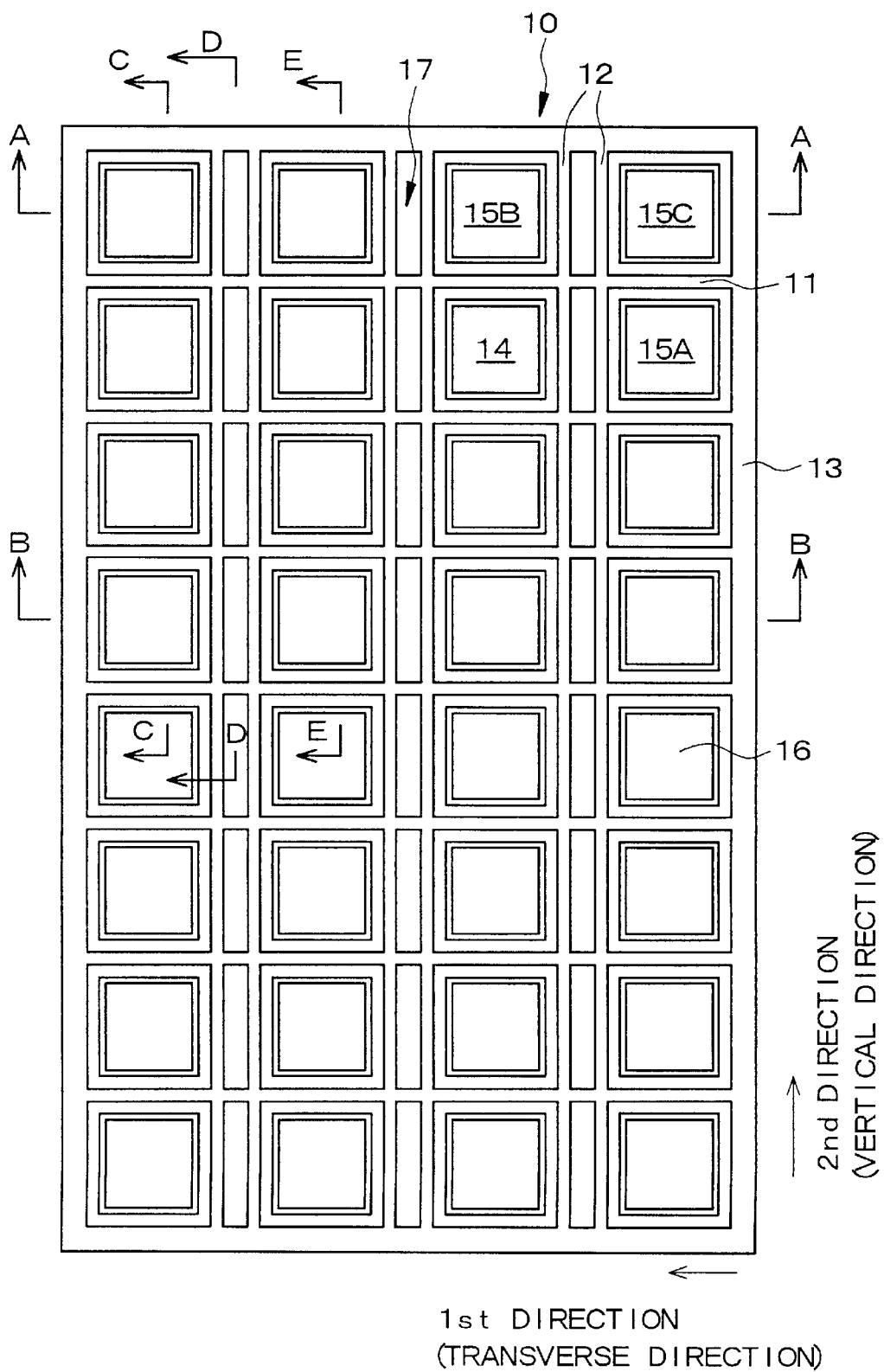

TRAY FOR SEMICONDUCTOR INTEGRATED CIRCUIT DEVICES

BACKGROUND OF THE INVENTION

1. Field of the Invention

The present invention relates to a tray for a plurality of semiconductor integrated circuit devices, the tray being used for baking the semiconductor integrated circuit devices in a state where the semiconductor integrated circuit devices are seated or received thereon, and a method of baking semiconductor integrated circuit devices using the above tray.

2. Description of Related Art

A tray, made of a resin, for semiconductor integrated circuit devices (to be sometimes referred to as "IC tray" hereinafter) is used in the step of drying semiconductor integrated circuit devices under heat, during the tests of testing produced semiconductor integrated circuit devices including the step of inspection thereof, or during the transportation thereof. In the step of producing a resin-sealed or resinen-capsulated semiconductor integrated circuit device (to be sometimes referred to as "IC" hereinafter), generally, soldering is carried out at a high temperature. When a sealing resin for sealing an IC (an epoxy resin is generally used) contains water, the problem is that the water in the sealing resin sharply evaporates due to heat during the soldering step so that the sealing resin undergoes cracking. To overcome the above problem, the process of IC production includes a baking treatment step for removing water contained in the sealing resin.

In the baking treatment, generally, ICs are dried at a temperature between 120° C. and 140° C. for at least 24 hours by placing tens of IC trays having a plurality of ICs thereon in a hot air oven in a state in which the IC trays are stacked one on another.

However, the above baking treatment involves the following problem. During the above drying process, particularly, immediately after the heating is initiated, the IC trays are twisted to be deformed, and the stacked IC trays may be overturned, or the ICs may fall out of the IC trays. These cause damage to the ICs, and the ICs work improperly. It is said that one of causes of twisting of the IC trays in the baking treatment is as follows. That is, the ICs are dried under heat in a state where the IC trays are stacked in a multiple form, heat is not uniformly or immediately conducted to the central portions of the IC trays in view of both the form and the material of the IC trays, and the temperature distribution varies widely between the circumferential portion and the central portion of the IC tray. As a result, a local stress or an uneven stress occurs in the IC tray.

Techniques for improving the drying efficiency of the baking treatment under heat using the IC trays are disclosed, e.g., in JP-A-2-232944 and JP-A-3-43383. JP-A-2-232944 discloses an IC tray which has opening portions in an arbitrary form formed in its ICs-seating portions. The opening portions are located below lead portions of surface mount type ICs. It is said that the above opening portions improve the flow of air in the upward and downward directions so that the time period of the baking treatment can be decreased. JP-A-3-43383 discloses an IC tray which has cut portions provided in partition walls formed in an ICs-seating portions and cut portions provided in circumferential frame portions of the IC tray. The provided cut portions improve air flow in the IC tray in the horizontal direction.

Since, however, the IC trays disclosed in the above Japanese Laid-open Patent Publications have the opening portions and the cut portions in their ICs-seating portions, the opening portions and the cut portions are almost closed when ICs are seated in the ICs-seating portions. Further, the opening portions provided in the ICs-seating portions, or the cut portions provided in the partition walls formed in the ICs-seating portions and provided in the circumferential frame portions of the IC tray, have a small area, and thus these opening portions or the cut portions have little effect on attaining a uniform temperature distribution in the IC tray itself. Further, the IC trays disclosed in the above Japanese Laid-open Patent Publications are intended for efficiently evaporating water from a sealing resin of ICs, and the trays are not intended for preventing the twist-induced deformation of the IC trays themselves. Further, in the baking treatment, the twist-induced deformation of the IC tray is caused not only by the non-uniformity of the temperature distribution in the IC tray but also is caused greatly by the form and the structure of the IC tray as well. The above Japanese Laid-open Patent Publications do not at all refer to these points.

SUMMARY OF THE INVENTION

It is therefore an object of the present invention to provide a tray for semiconductor integrated circuit devices which is almost free from twisting and deformation in the step of drying a sealing resin of the semiconductor integrated circuit device under heat (during a baking treatment), and a method of baking semiconductor integrated circuits using the above tray.

A tray for semiconductor integrated circuit devices, according to a first aspect of the present invention for achieving the above object, comprises a plurality of first partition walls extending in a first direction, a plurality of second partition walls extending in a second direction at right angles with the first direction, and circumferential frame portions connecting end portions of the first and second partition walls, wherein regions surrounded by the first partition walls and the second partition walls constitute seating portions for seating semiconductor integrated circuit devices, the first partition walls are disposed such that one first partition wall is disposed between two rows of the seating portions which are adjacent to each other in the second direction, the second partition walls are disposed such that two second partition walls are disposed between two rows of the seating portions which are adjacent to each other in the first direction, and opening portions are formed between said two second partition walls.

A method of baking semiconductor integrated circuit devices, according to a first aspect of the present invention for achieving the above object, using the tray for semiconductor integrated circuit devices according to the above first aspect of the present invention, comprises stacking the trays having resin-sealed semiconductor integrated circuit devices seated in the seating portions in an oven, and drying a sealing resin of the semiconductor integrated circuit device under heat.

A tray for semiconductor integrated circuit devices, according to a second aspect of the present invention for achieving the above object, comprises a plurality of first partition walls extending in a first direction, a plurality of second partition walls extending in a second direction at right angles with the first direction, and circumferential frame portions connecting end portions of the first and second partition walls, wherein regions surrounded by the first partition walls and the second partition walls constitute seating portions for seating semiconductor integrated circuit devices, the first partition walls are disposed such that two first partition walls are disposed between two rows of the seating portions which are adjacent to each other in the second direction, opening portions are formed between said two first partition walls, the second partition walls are disposed such that two second partition walls are disposed between two rows of the seating portions which are adjacent to each other in the first direction, and opening portions are formed between said two second partition walls.

A method of baking semiconductor integrated circuit devices, according to a second aspect of the present invention for achieving the above object, using the tray for semiconductor integrated circuit devices according to the above second aspect of the present invention, comprises stacking the trays having resin-sealed semiconductor integrated circuit devices seated in the seating portions in an oven, and drying a sealing resin of the semiconductor integrated circuit device under heat.

In the method of baking semiconductor integrated circuit devices according to the first or second aspect of the present invention, preferably, the baking treatment is efficiently carried out by providing a metal plate having a plurality of openings, e.g., a net made of a metal or a wire net, in the oven, and drying the sealing resin of the semiconductor integrated circuit device under heat in a state where a stack of the trays having resin-sealed semiconductor integrated circuit devices seated in the seating portions is placed on the metal plate.

In the tray for semiconductor integrated circuit devices (IC tray) according to the first or second aspect of the present invention or in the method of baking semiconductor integrated circuit devices using these IC trays (the above IC trays and the above methods will be sometimes simply referred to as "the present invention" hereinafter), cut portions may be formed in the circumferential frame portions.

In the present invention, the size of each opening portion is desirably designed as follows. The area of each opening portion is at least 1/20, more preferably at least 1/10, still more preferably at least 1/5 as large as the area of each seating portion. The upper limit of the area of each opening portion in the IC tray can be determined depending upon the size and the number of the seating portions in the IC tray, outer dimensions of the IC tray and the strength which the IC tray is required to have. The form of each opening portion viewed in a plan view, may be any arbitrary form, while it is preferably rectangular. The ratio of area of the opening portion to the area of a zone in which the opening portion is formed and which is surrounded by the first partition walls and the second partition walls is preferably 1. However, the above ratio shall not be limited to 1, and it can be at least 0.2.

In the present invention, since the opening portions are provided, the contribution weight of the partition walls for imparting rigidity to the IC tray as a whole increases. It is therefore desirable to form the partition walls having a uniform thickness. When the partition walls have non-uniform thicknesses and the rigidity of the IC tray is poorly balanced, the IC tray may be susceptible to being twist-deformed to a greater extent. The wall thickness of each partition wall is 0.5 mm to 5 mm, preferably 1 mm to 3 mm. The thickness of each of the first partition walls and the thickness of each of the second partition walls may be the same or may be different, and these thicknesses are determined by taking account of the rigidity of the IC tray. The height of each partition wall can be determined depending upon the height of ICs and the rigidity which the IC tray is required to have. The above height is, for example, 5 mm to 20 mm, preferably 5 mm to 10 mm, although it shall not be limited thereto.

In the present invention, the IC tray can be produced from a resin by an injection molding method or an injection compression molding method. The above resin includes generally used thermoplastic resins such as a polypropylene resin, generally used engineering plastics such as a polycarbonate resin, a modified polyphenylene ether resin, a polyamide resin, an aromatic polyamide resin, a polyacetal resin, a polyethylene terephthalate resin and a polybutylene terephthalate resin, and special engineering plastics such as polyphenylene sulfide and a liquid crystal polymer. The above resin may contain an electrically conductive material such as carbon black, a filling material such as a filler or a whisker and various other additives as required. Examples of resin-sealed semiconductor integrated circuit devices classified on the basis of package shapes thereof include a small outline package (SOP), a small outline I-leaded package (SOI), a small outline J-leaded package (SOJ), a shrink small outline package (SSOP), a thin small outline package (TSOP), a dual in-line package (DIP), a quad flat package (QFP), a quad flat I-leaded package (QFI), a quad flat J-leaded package (QFJ), a quad flat non-leaded package (QFN), a guard ring quad flat package (GQFP), a bumpered quad flat package (BQFP), a shrink zigzag in-line package (SZIP), a pin grid array package (PGA) and a single in-line package (SIP).

In the present invention, even if the IC tray is not uniformly heated for some reason so as to cause a local or non-uniform stress in the IC tray, the stress caused in some place of the IC tray is not propagated to the entire IC tray since the opening portions are formed in the IC tray. As a result, the IC tray is only locally deformed, and the deformation of the entire IC tray such as a twist deformation can be prevented so that the IC tray is free from being twisted and deformed as far as the form is concerned.

Further, when tens of the IC trays having the opening portions are stacked one on another, combinations of the opening portions go through from the IC tray in the uppermost position to the IC tray in the lowermost position, and each combination of the opening portions works as a path for heat. The upward or downward heat (thermal) conduction in the IC trays is therefore remarkably improved, and a uniform temperature distribution of the IC tray per se can be attained. Further, when the cut portions are formed in the circumferential frame portions, the heat conduction in the horizontal direction can be also improved. Further, since the opening portions and the seating portions are alternately formed in each tray, the difference in heat-drying conditions among the seating portions can also be decreased.

BRIEF DESCRIPTION OF THE DRAWINGS

FIG. 1 is a schematic plan view of an IC tray in Example 1.

DETAILED DESCRIPTION OF THE INVENTION

Figure 2A:
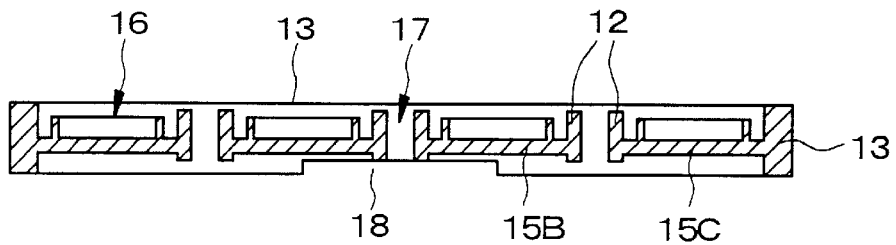
FIGS. 2A, 2B, 2C, 2D and 2E are schematic cross-sectional views of the IC tray taken along lines A—A, B—B, C—C, D—D and E—E in FIG. 1.
Figure 2B:
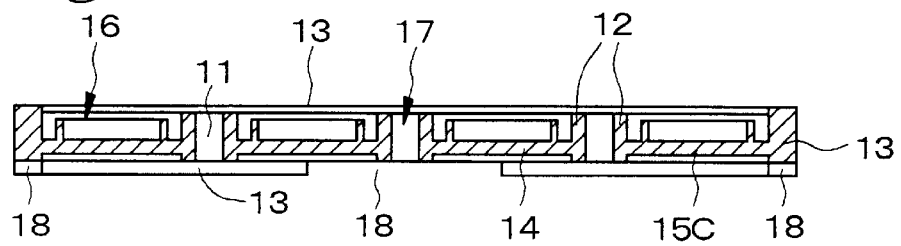
Figure 2C:
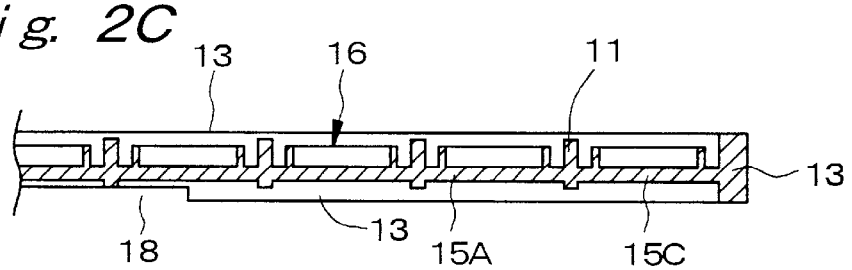
Figure 2D:
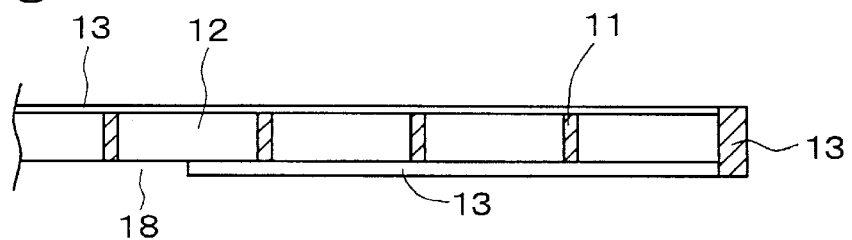
Figure 2E:
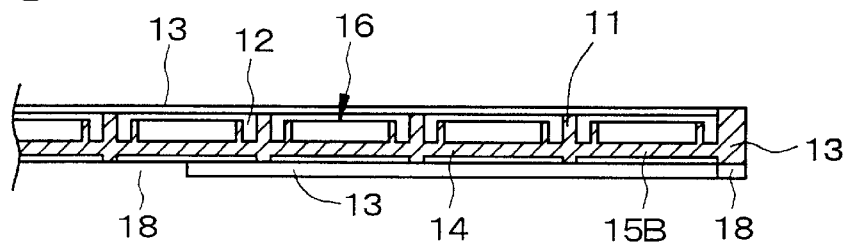

The present invention will be explained on the basis of Examples with reference to the drawings, while the present invention shall not be limited to the Examples.

EXAMPLE 1

Example 1 is concerned with an IC tray according to the first aspect of the present invention and a method of baking semiconductor integrated circuit devices using the above IC trays according to the first aspect of the present invention. FIG. 1 shows a schematic plan view of the IC tray in Example 1, and FIGS. 2A, 2B, 2C, 2D and 2E show schematic cross-sectional views of the IC tray taken along lines A—A, B—B, C—C, D—D and E—E in FIG. 1. The IC tray 10 has a plurality of first partition walls 11 extending in a first direction (e.g., in a transverse direction), a plurality of second partition walls 12 extending in a second direction (e.g., in a vertical direction) at right angles with the first direction, and circumferential frame portions 13 connecting the end portions of the first and second partition walls 11 and 12. Each of regions 14 are surrounded by a pair of the first partition walls 11 and a pair of the second partition walls 12, and constitutes a seating portion 16 where a semiconductor integrated circuit device is to be seated. Further, regions 15A are surrounded by pairs of the first partition walls 11, one second partition wall 12 and one circumferential frame portion 13, regions are 15B surrounded by one first partition wall 11, pairs of the second partition walls 12 and one circumferential frame portion 13, and regions 15C are surrounded by one first partition wall 11, one second partition wall 12 and two circumferential frame portions 13. Regions 15A, 15B, 15C constitute seating portions 16 in which semiconductor integrated circuit devices are to be seated. Each of the seating portions 16 integrally extends from, for example, the side surfaces of the first partition walls 11 and the second partition walls 12.

Further, one first partition wall 11 is disposed between two rows of the seating portions 16 which are adjacent to each other in the second direction (e.g., vertical direction), two second partition walls 12 are disposed between two rows of the seating portions 16 which are adjacent to each other in the first direction (e.g., transverse direction), and opening portions 17 are formed between the above two second partition walls 12. That is, almost all of the lattice-like seating portions 16 are constituted of pairs of the second partition walls 12 and pairs of the first partition walls 11, and the opening portion 17 is formed between the second partition walls 12 of each pair. In other words, the opening portions 17 and the seating portions 16 are alternately disposed along the first direction (e.g., transverse direction). Further, cut portions 18 are provided in parts of the circumferential frame portions 13. In a state where tens of the IC trays 10 are stacked one on another, combinations of the opening portions 17 go through from the IC tray in the uppermost position to the IC tray in the lowermost position. The number of the seating portions 16 of the IC tray 10, shown in FIG. 1 and FIGS. 2A to 2E, differs from the number of the seating portions 16 of the actually produced IC tray 10 due to the simplification of the drawings. The upper surface of the circumferential frame portions 13 is provided with a concave portion (or convex portion), and the lower surface of the circumferential frame portions 13 is provided with a convex portion (or concave portion), so as to engage the concave portion with the convex portion to each other when the IC trays are stacked. When a plurality of the IC trays 10 are structured as described above, the IC trays can be reliably stacked.

In the IC trays 10 in Example 1, ninety seating portions were formed, fifteen rows of the seating portions in the vertical direction and six rows of the seating portions in the transverse direction. The IC tray had outer dimensions of 335 mm in the vertical direction and 180 mm in the transverse direction. The tolerances of the outer dimensions of the injection-molded IC tray 10 before the baking treatment to the basic designed form of the IC tray 10 is −1.5 mm to +0 mm both in the vertical and the transverse directions, and the warpage tolerance in the thickness direction of the injection-molded IC tray 10 before the baking treatment to the basic designed form of the IC tray 10 is 1 mm or less. The above tolerances of the outer dimensions of the injection-molded IC tray 10 before the baking treatment to the basic designed form, and the above warpage tolerance in the thickness direction thereof before the baking treatment to the basic designed form will be simply referred to as "outer dimensional tolerances" and "warpage tolerance" hereinafter. Each seating portion 16 for seating an IC had a size of 20 mm×20 mm. Further, two partition walls 12, positioned between the seating portions 16 adjacent to each other in the first direction, had a distance of 3.5 mm. Each opening portion therefore had a size of 3.5 mm×20 mm. Each first partition wall 11 had a thickness of 2.0 mm, and each second partition wall 12 had a thickness of 1.5 mm. The IC trays 10 were produced from a high heat-resistant modified PPE resin ("Iupiace EHM1110A" supplied by Mitsubishi Engineering-Plastics Corp.) by an injection molding method. Each injection-molded IC tray was measured for an outer dimension in the vertical direction, an outer dimension in the transverse direction and a warpage to show that the measurement data were all within the outer dimension tolerances and the warpage tolerance. The IC trays 10, therefore, had no problem in view of dimensional accuracy after the injection molding operation.

Figure 3:
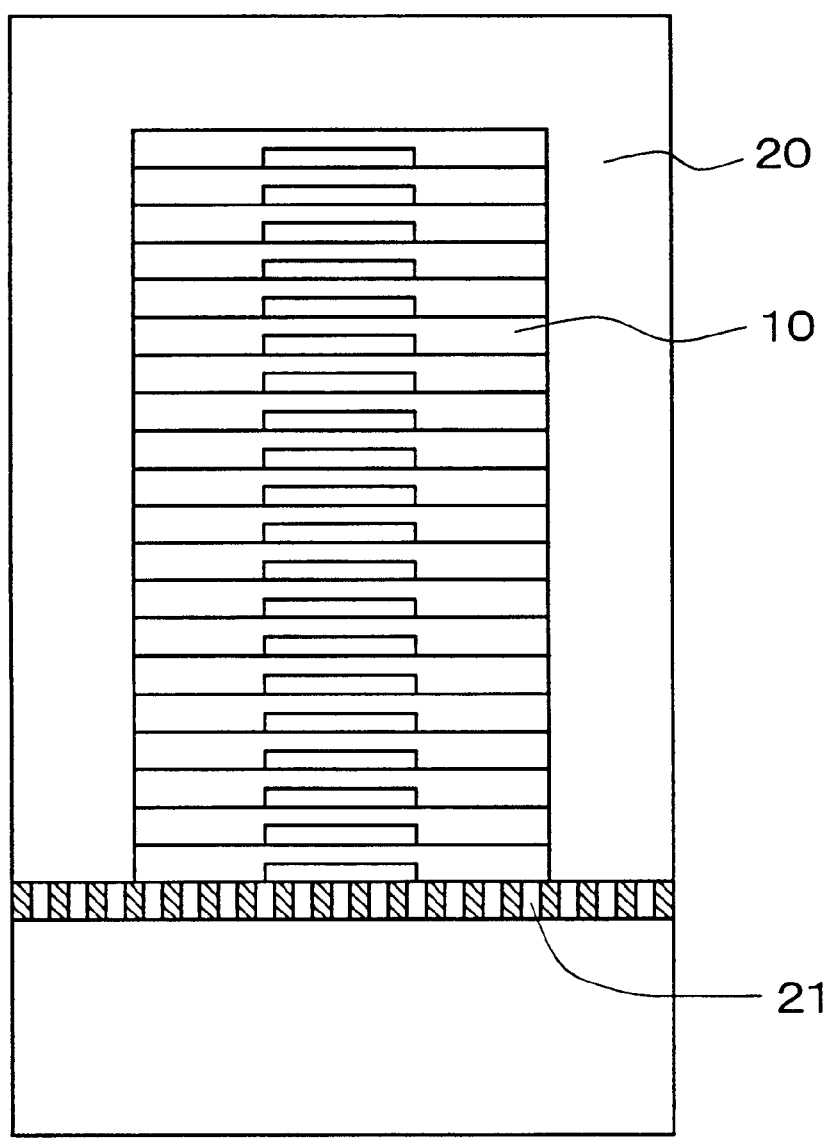
FIG. 3 is a schematic view of an oven, etc., which shows the method of baking semiconductor integrated circuit devices in Example 1.

In Example 1, as schematically shown in FIG. 3, resin-sealed semiconductor integrated circuit devices were seated or received in the seating portions 16 of twenty IC trays 10. The twenty IC trays 10 were stacked, and the IC trays 10 were positioned in a state where a stack of the IC trays 10 was placed on a wire net 21 placed inside a hot air oven 20 set at a temperature of 135° C. The sealing resin of the semiconductor integrated circuit device was dried under heat for 24 hours. At the initial stage of the baking treatment, i.e., at a stage before the temperature distribution of the IC trays 10 came to be a stationary state during the baking treatment, neither ICs fell from the IC trays nor the IC trays collapsed, which are conventionally liable to take place due to sharp large deformations such as a twist deformation and buckling which are easily liable to take place during the above initial stage. When the IC trays 10 were allowed to cool to room temperature after the baking treatment, the IC trays 10 showed no residual permanent deformations such as twist deformation which would cause trouble with respect to the re-use thereof. Further, when the IC trays 10 were used three times for the baking treatment, the IC trays 10 showed no twist deformation. After the IC trays 10 were used three times for the baking treatment, each IC tray was measured for an outer dimension in the vertical direction, an outer dimension in the transverse direction and a warpage to show that the measurement data were all within the outer dimension tolerances and the warpage tolerance. The IC trays 10 therefore had no problem in view of dimensional accuracy after thermal cycle load and in view of durability.

Figure 11:
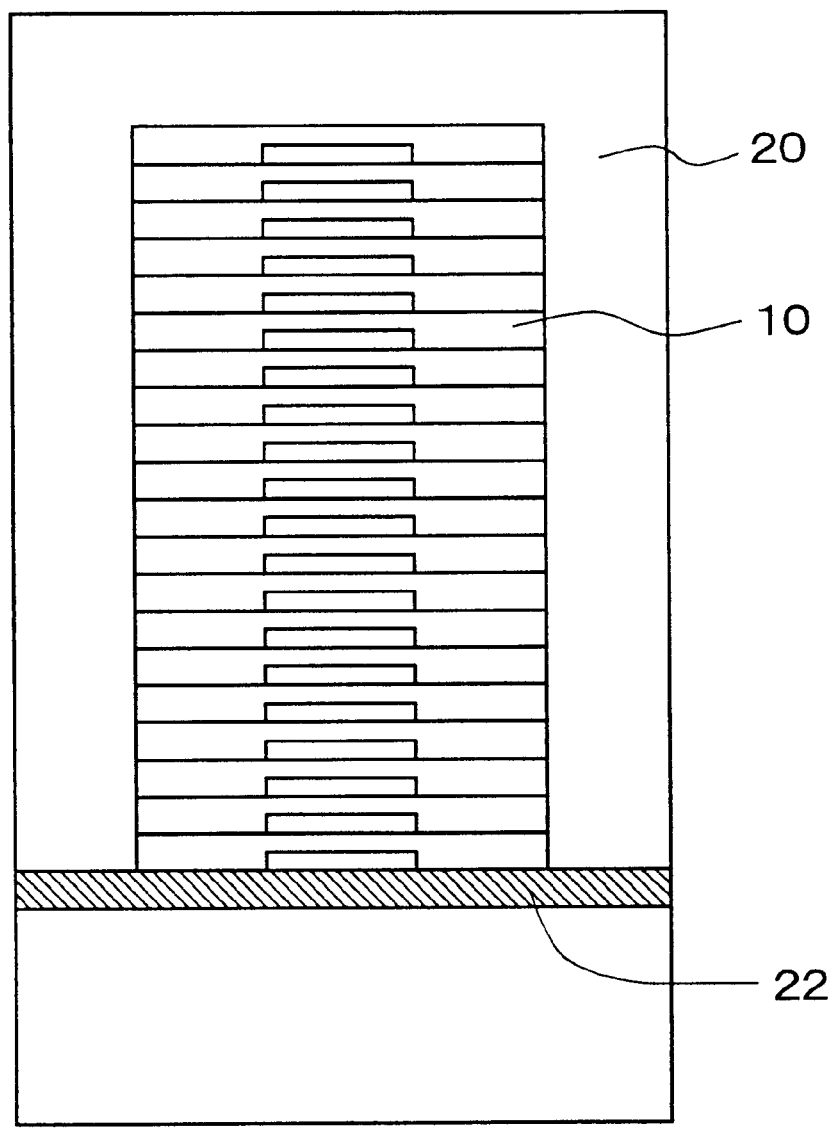
FIG. 11 is a schematic view of an oven for the conventional baking treatment of semiconductor integrated circuit devices.

As schematically shown in FIG. 11, a conventional hot air oven 20 used for baking treatment has a metal plate 22 made of aluminum or the like without any openings positioned inside it, and IC trays are stacked on the metal plate 22. However, when the metal plate 22 is used, it closes the opening portions of the IC tray stacked in the lowermost position, so that heat is only conducted within the IC trays by natural convection heat conduction, and the heating effect is greatly decreased. As shown in FIG. 3, the wire net 21 is provided in the hot air oven 20, and a stack of the IC trays 10 is arranged on the wire net 21 for drying under heat. In this case, heat paths are secured between the IC tray 10 placed in the uppermost position and the IC tray 10 placed in the lowermost position, and heat can be conducted to the interior of the IC trays 10 placed in intermediate positions, so that there is produced a great effect on attaining a uniform temperature distribution in the IC tray 10. However, further, the IC trays 10 produced in Example 1 were placed in the conventional hot air oven 20 shown in FIG. 11 in a state where a stack of the IC trays was placed on the metal plate 22, and the sealing resin of the semiconductor integrated circuit devices was dried under heat for 24 hours. During and after the baking treatment, the IC trays 10 showed no twist deformation. Further, after the baking treatments, each IC tray was measured for an outer dimension in the vertical direction, an outer dimension in the transverse direction and a warpage to show that the measurement data were all within the outer dimension tolerances and the warpage tolerance. The IC trays 10 therefore had no problem in view of dimensional accuracy after thermal cycle load and in view of durability.

COMPARATIVE EXAMPLE 1

Figure 12A:
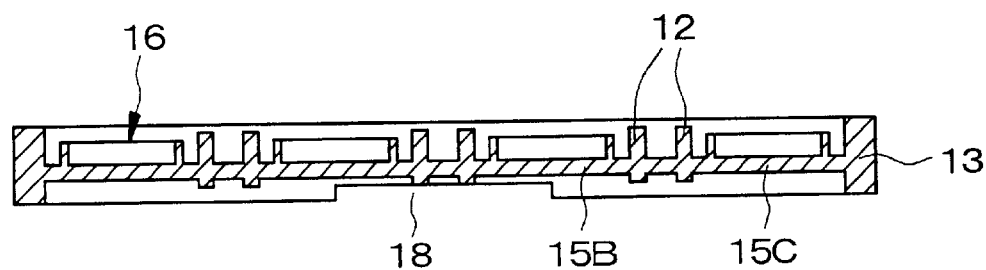
FIGS. 12A and 12B are schematic cross-sectional views of an IC tray in Comparative Example 1, which are similar to the schematic cross-sectional views taken along lines A—A and C—C in FIG. 1.
Figure 12B:
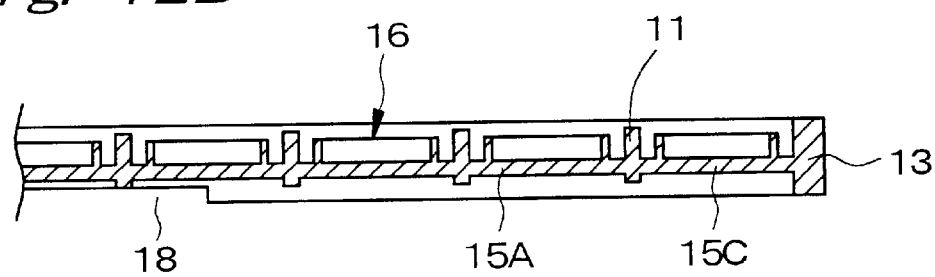

Baking treatment was carried out using IC trays having the form similar to the form of the IC trays produced in Example 1 but different in that opening portions were closed with a resin. FIGS. 12A and 12B show schematic cross-sectional views of each IC tray in Comparative Example 1 in which no opening portions were formed. The cross-sectional views shown in FIGS. 12A and 12B are similar to the cross-sectional views taken along lines A—A and B—B in FIG. 1. The IC trays in Comparative Example 1 were produced from the same resin as the resin used in Example 1 by the same method as that in Example 1.

In Comparative Example 1, as schematically shown in FIG. 3, resin-sealed semiconductor integrated circuit devices were seated or received in the seating portions 16 of twenty IC trays 10, the twenty IC trays 10 were stacked, the IC trays were positioned in a state where a stack of the IC trays was placed on a wire net 21 placed inside a hot air oven 20 set at a temperature of 135° C. and the sealing resin of the semiconductor integrated circuit device was dried under heat. As a result, some time after the baking treatment step was initiated, the IC trays in the top and bottom positions gradually started to undergo twist deformation, and the twist deformation gradually spread toward the IC trays in the intermediate positions. When 8 hours passed after the initiation of the baking treatment, the stacked trays as a whole suddenly and sharply buckled or were deformed. Further, when the drying operation was continued for 40 hours, the twist deformation terminated and the IC trays were restored to a flat state.

EXAMPLE 2

Figure 4:
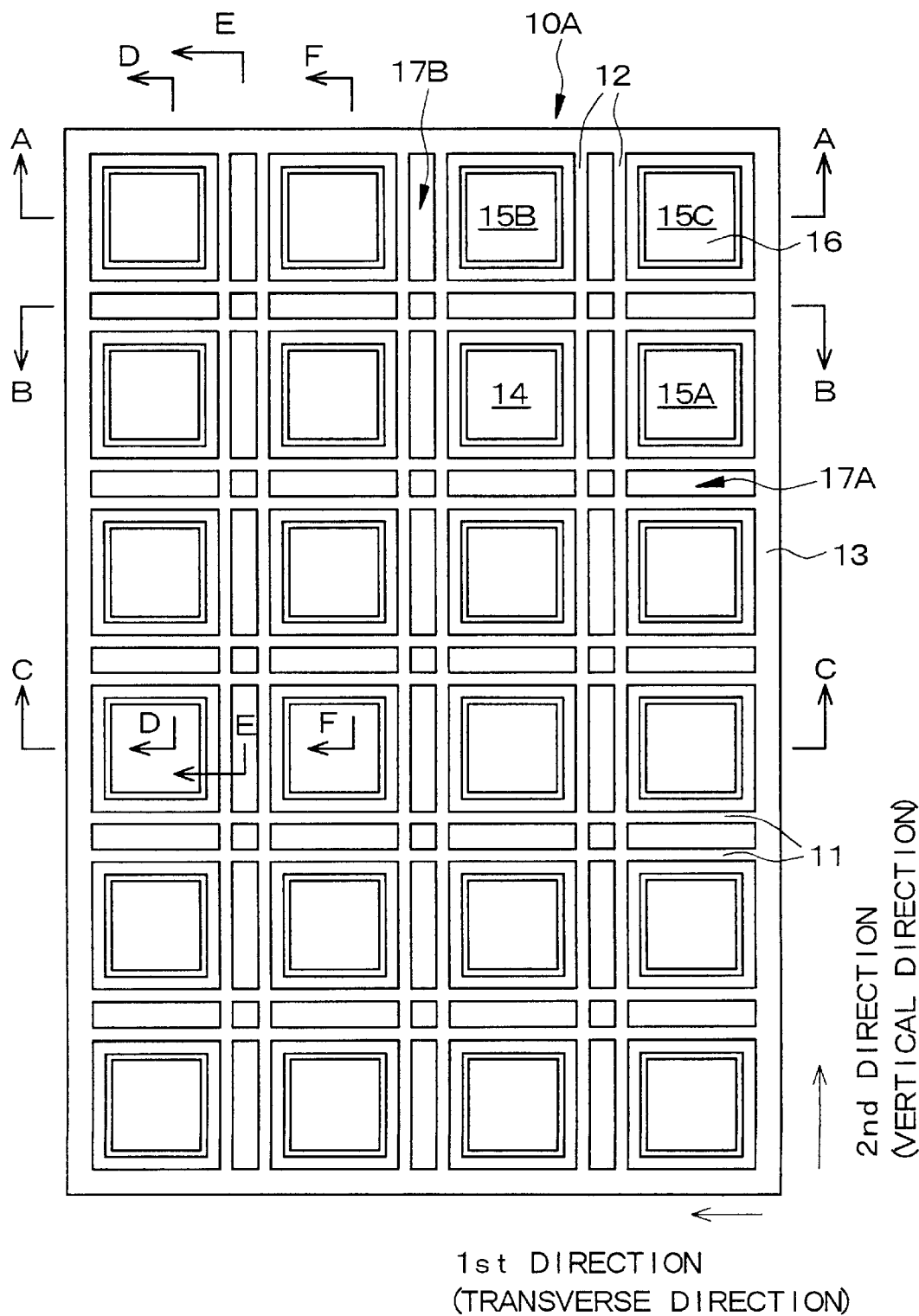
FIG. 4 is a schematic plan view of an IC tray in Example 2.
Figure 5A:
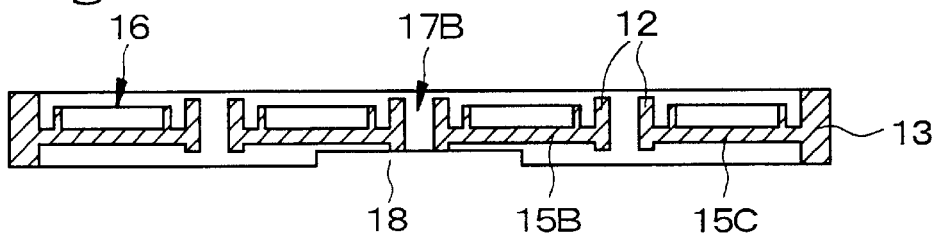
FIGS. 5A, 5B, 5C, 5D, 5E and 5F are schematic cross-sectional views of the IC tray taken along lines A—A, B—B, C—C, D—D, E—E and F—F in FIG. 4.
Figure 5B:
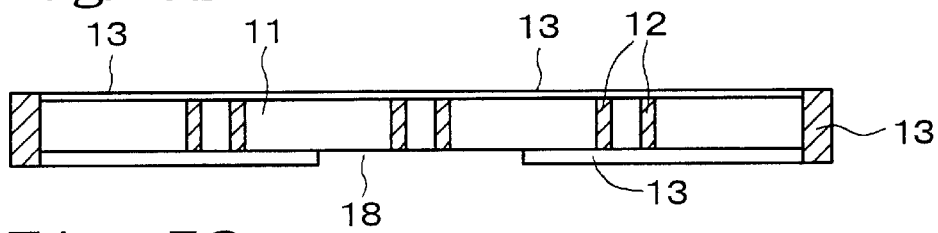
Figure 5C:
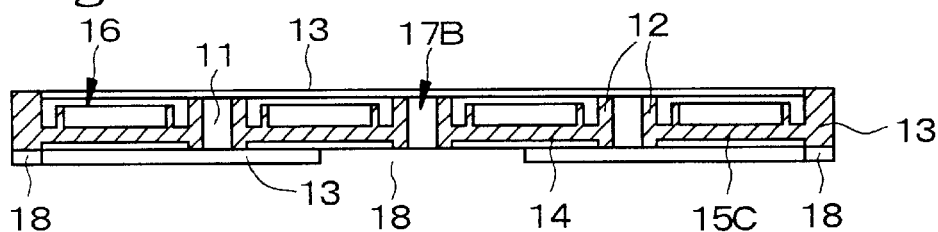
Figure 5D:
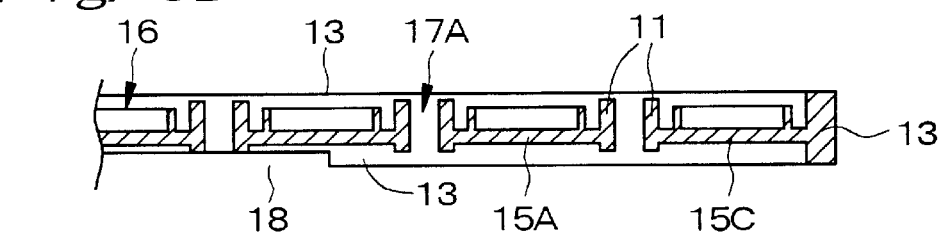
Figure 5E:
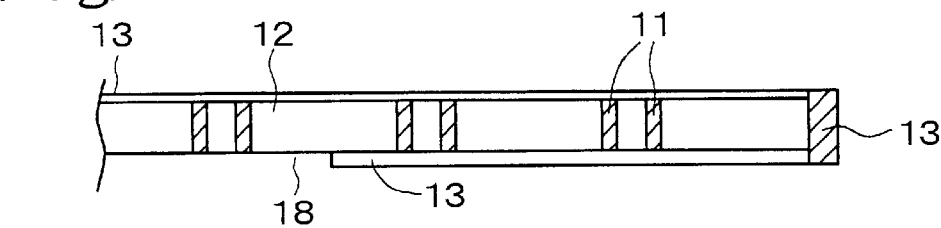
Figure 5F:
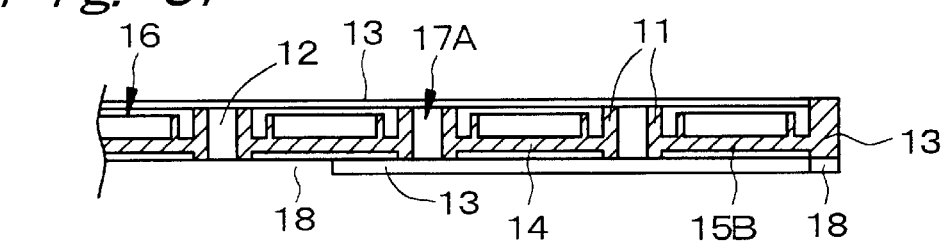

Example 2 is concerned with an IC tray according to the second aspect of the present invention and a method of baking semiconductor integrated circuit devices using the above IC trays according to the second aspect of the present invention. FIG. 4 shows a schematic plan view of the IC tray in Example 2, and FIGS. 5A, 5B, 5C, 5D, 5E and 5F show schematic cross-sectional views of the IC tray taken along lines A—A, B—B, C—C, D—D, E—E and F—F in FIG. 4. The IC tray 10A has a plurality of first partition walls 11 extending in a first direction (e.g., in a transverse direction), a plurality of second partition walls 12 extending in a second direction (e.g., in a vertical direction) at right angles with the first direction, and circumferential frame portions 13 connecting the end portions of the first and second partition walls 11 and 12. Each of regions 14 surrounded by a pair of the first partition walls 11 and a pair of the second partition walls 12 constitutes a seating portion 16 in which a semiconductor integrated circuit device is to be seated. Further, regions 15A surrounded by pairs of the first partition walls 11, one second partition wall 12 and one circumferential frame portion 13, regions 15B surrounded by one first partition wall 11, pairs of the second partition walls 12 and one circumferential frame portion 13, and regions 15C surrounded by one first partition wall 11, one second partition wall 12 and two circumferential frame portions 13 constitute seating portions 16 in which semiconductor integrated circuit devices are to be seated. Each of the seating portions 16 integrally extends from, for example, the side surfaces of the first partition walls 11 and the second partition walls 12.

Further, two first partition walls 11 are disposed between two rows of the seating portions 16 which are adjacent to each other in the second direction (e.g., vertical direction), and opening portions 17A are formed between the above two first partition walls 11. Further, two second partition walls 12 are disposed between two rows of the seating portions 16 which are adjacent to each other in the first direction (e.g., transverse direction), and opening portions 17B are formed between the above two second partition walls 12. That is, almost all of the lattice-like seating portions 16 are constituted of pairs of the second partition walls 12 and pairs of the first partition walls 11. The opening portions 17A are formed between the first partition walls 11 of each pair, and the opening portions 17B are formed between the second partition walls 12 of each pair. In other words, the opening portions 17A and the seating portions 16 are alternately disposed along the second direction (vertical direction), and the opening portions 17B and the seating portions 16 are alternately disposed along the first direction (transverse direction). Further, cut portions 18 are provided in parts of the circumferential frame portions 13. In a state where tens of the IC trays 10A are stacked one on another, combinations of the opening portions 17A and 17B go through from the IC tray in the uppermost position to the IC tray in the lowermost position.

In the IC trays 10A in Example 2, ninety seating portions were formed, fifteen rows of the seating portions in the vertical direction and six rows of the seating portions in the transverse direction. The IC tray had outer dimensions of 400 mm in the vertical direction and 180 mm in the transverse direction. Each seating portion 16 for seating an IC had a size of 20 mm×20 mm. Further, two first partition walls 11 positioned between the seating portions 16 adjacent to each other had a distance of 3.5 mm, and two second partition walls 12 positioned between the seating portions 16 adjacent to each other had a distance of 3.5 mm. Each of the opening portions 17A and the opening portions 17B therefore had a size of 3.5 mm×20 mm. Each first partition wall 11 had a thickness of 1.5 mm, and each second partition wall 12 had a thickness of 1.5 mm. Like Example 1, the IC trays 10A were produced from a high heat-resistant modified PPE resin ("Iupiace EHM1110A" supplied by Mitsubishi Engineering-Plastics Corp.) by an injection molding method. Each injection-molded IC tray was measured for an outer dimension in the vertical direction, an outer dimension in the transverse direction and a warpage to show that the measurement data were all within the outer dimension tolerances and the warpage tolerance. The IC trays 10 therefore had no problem in view of dimensional accuracy after the injection molding operation.

In Example 2, as schematically shown in FIG. 3, resin-sealed semiconductor integrated circuit devices were seated or received in the seating portions 16 of twenty IC trays 10A. The twenty IC trays 10A were stacked, the IC trays 10A were positioned in a state where a stack of the IC trays 10A was placed on a wire net 21 placed inside a hot air oven 20 set at a temperature of 135° C., and the sealing resin of the semiconductor integrated circuit device was dried under heat for 24 hours. At the initial stage of the baking treatment, i.e., at a stage before the temperature distribution of the IC trays 10 came to be a stationary state during the baking treatment, neither ICs fell from the IC trays nor the IC trays collapsed, which are conventionally liable to take place due to sharp large deformations such as a twist deformation and a buckling which are easily liable to take place at the above initial stage. When the IC trays 10 were allowed to cool to room temperature after the baking treatment, the IC trays 10 showed no residual permanent deformations such as twist deformation which would cause trouble with respect to re-use thereof. Further, when the IC trays 10A were used three times for the baking treatment, the IC trays 10A showed no twist deformation. Further, after the baking treatments, each IC tray was measured for an outer dimension in the vertical direction, an outer dimension in the transverse direction and a warpage to show that the measurement data were all within the outer dimension tolerances and the warpage tolerance. The IC trays 10 therefore had no problem in view of dimensional accuracy after thermal cycle load and in view of durability.

Figure 6:
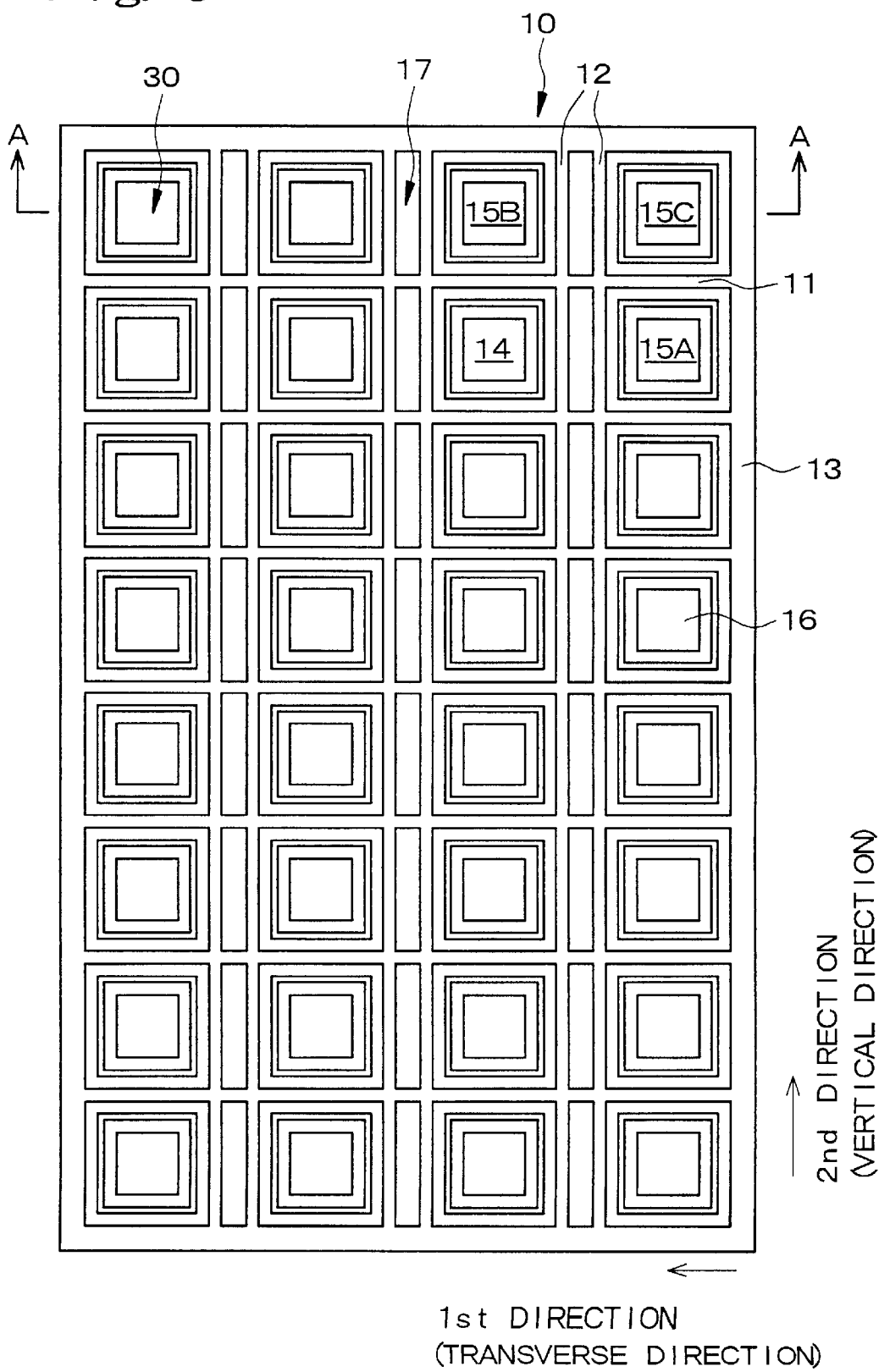
FIG. 6 is a schematic plan view of a variant of the IC tray in Example 1.
Figure 7:
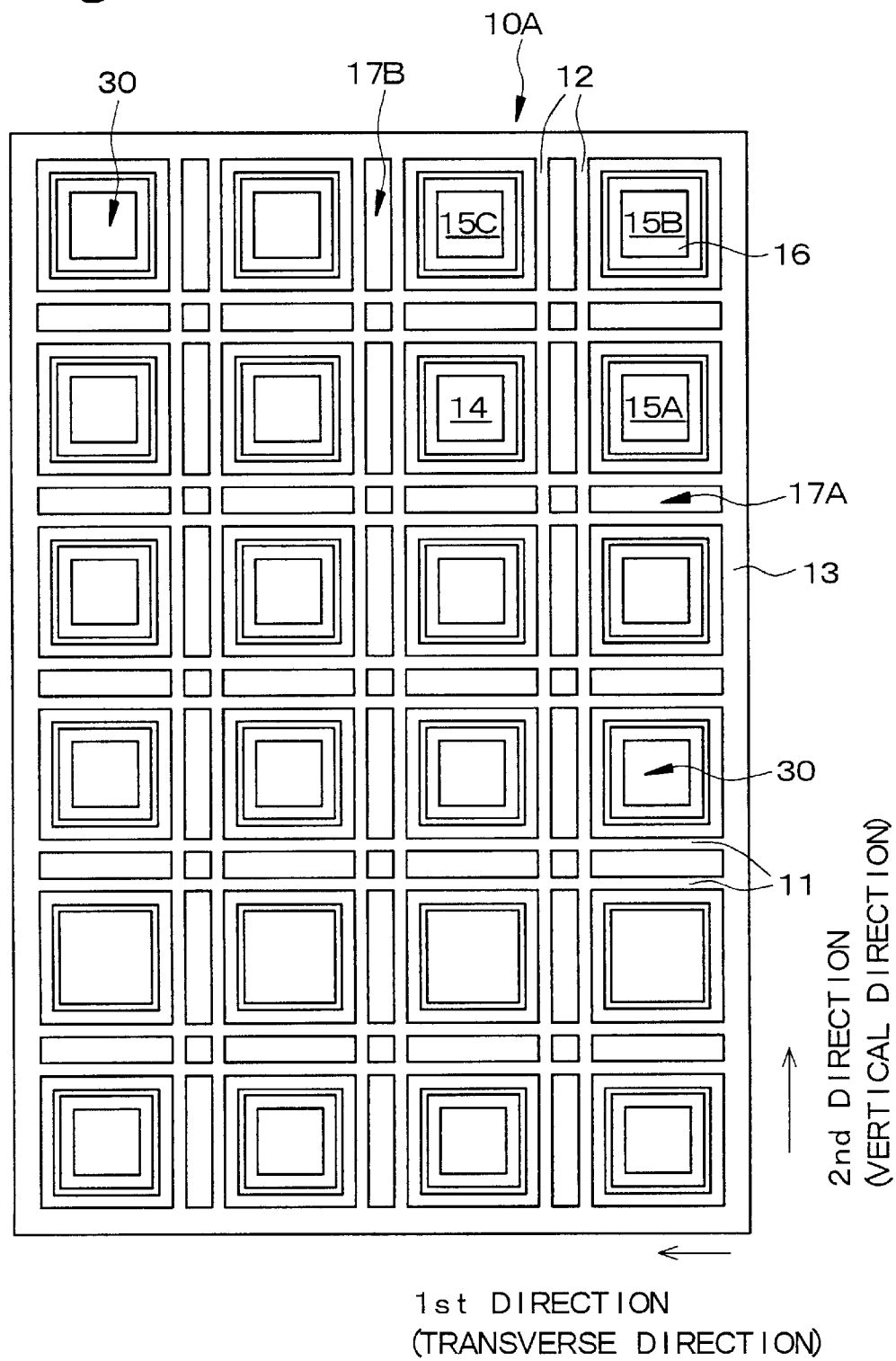
FIG. 7 is a schematic plan view of a variant of the IC tray in Example 2.
Figure 8:
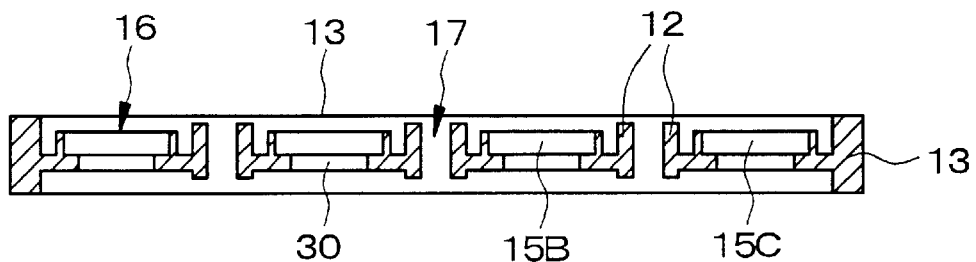
FIG. 8 is a schematic cross-sectional view of the IC tray taken along a line A—A in FIG. 6.

The present invention has been explained with reference to preferred embodiments hereinabove, while the present invention shall not be limited thereto. The form and the size of the IC trays, dimensions of each portion, the material used for the production of the IC trays, the method of producing of the IC trays, conditions of the baking treatment, and the like explained in Examples are examples, and may be modified as required. In the Examples, the first direction is described as the transverse direction, and the second direction is described as the vertical direction, while the first direction may be the vertical direction, and the second direction may be the transverse direction. For example, as shown in the schematic plan views of FIGS. 6 and 7, rectangular through-holes 30 may be formed in seating portions 16. The through-holes may have any form, and the number of the through-holes per seating portion 16 is arbitrary. FIG. 8 shows a schematic cross-sectional view taken along a line A—A in FIG. 6. In the Examples, further, the opening portions 17, 17A and 17B are formed in all of zones surrounded by the first partition walls 11 and the second partition walls 12 (excluding the seating portions), while the opening portions 17, 17A and 17B may be formed only in parts of the above zones.

Figure 9A:
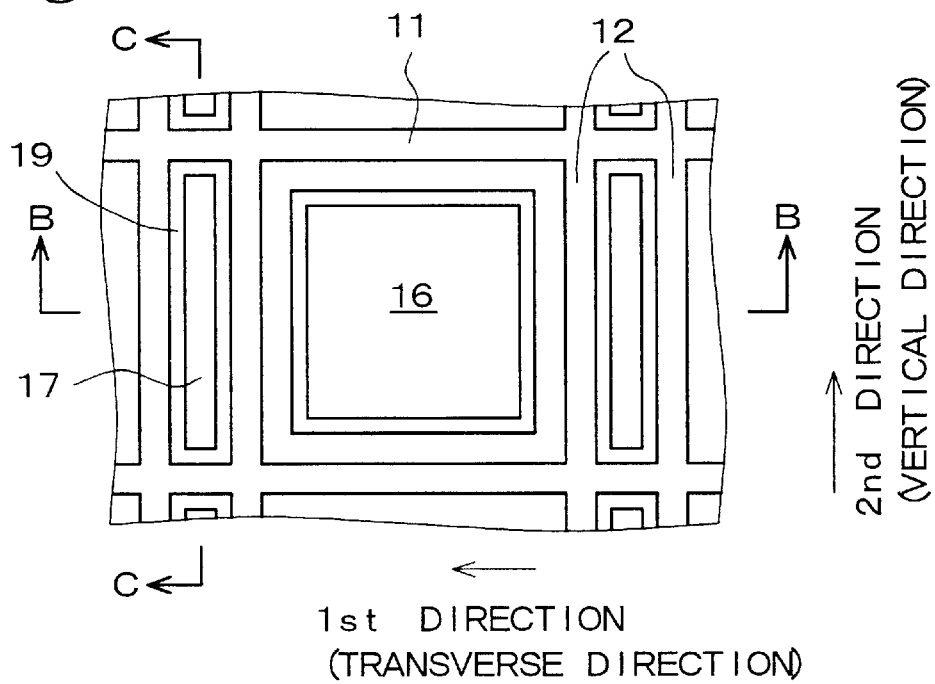
FIG. 9A is a schematic plan view of one seating portion and the immediate surrounding structure of an IC tray, for showing a variant of the form of an opening portion.
Figure 9B:
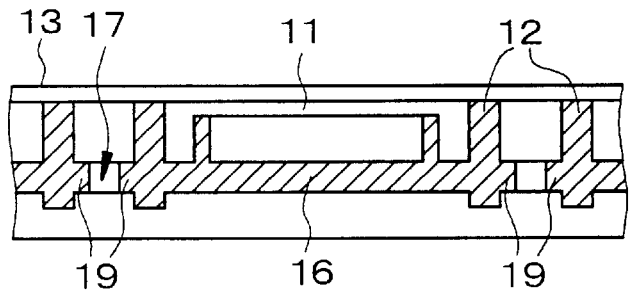
FIGS. 9B and 9C are partial cross-sectional views thereof.
Figure 9C:
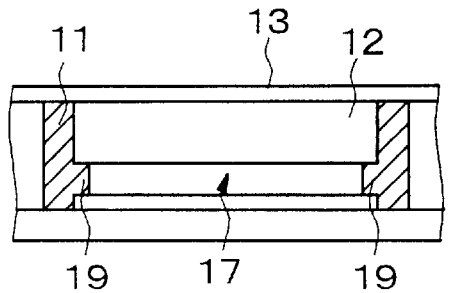

Not all of the zones surrounded by the first partition walls 11 and the second partition walls 12 (excluding the seating portions) may be occupied by the opening portions 17, 17A and 17B. FIG. 9A shows a schematic plan view of one seating portion 16 and the surrounding vicinity thereof in the so-constituted IC tray, and FIGS. 9B and 9C show schematic partial cross-sectional views thereof. FIGS. 9B and 9C are schematic cross-sectional views taken along lines B—B and C—C in FIG. 9A. In this example, in each of the zones surrounded by the first partition walls 11 and the second partition walls 12 (excluding IC seating portions), not only an opening portion 17 is formed, but also horizontally extending portions 19 of the first and second partition walls 11 and 12 are formed. The IC tray shown in FIGS. 9A, 9B and 9C is a variant of the IC tray in Example 1, while this variation can be also applied to the IC tray described in Example 2. Further, the horizontally extending portions 19 may be extended only from the first partition walls 11 or only from the second partition walls 12.

Figure 10A:
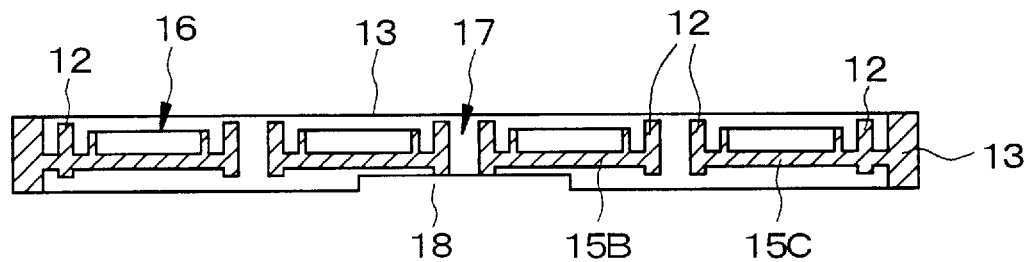
FIGS. 10A, 10B, 10C and 10D are schematic cross-sectional views of a variant of the IC tray in Example 1.
Figure 10B:
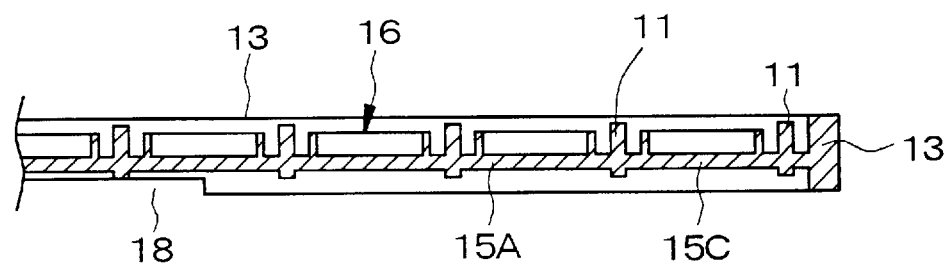
Figure 10C:
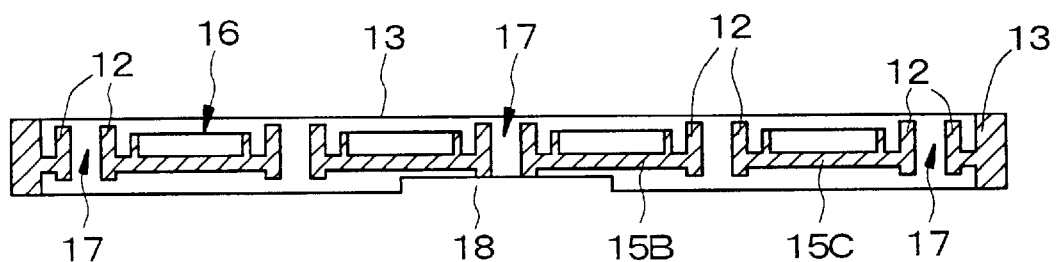
Figure 10D:
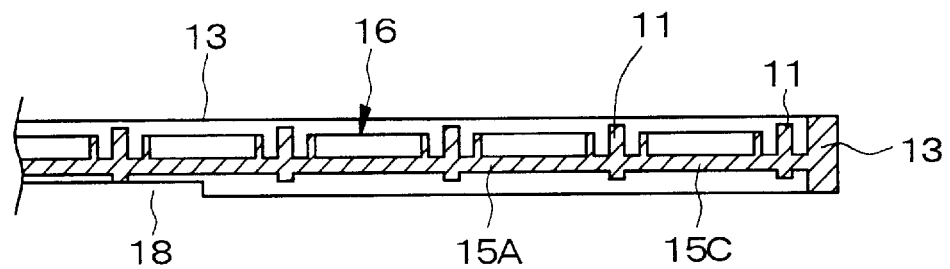

In the Examples, the seating portions for seating ICs are constituted not only in regions 14 surrounded by the first partition walls 11 and the second partition walls 12 but also in regions 15A, 15B and 15C surrounded by the first partition wall(s) 11, the second partition wall(s) 12 and the circumferential frame portion(s) 13, while the IC tray of the present invention shall not be limited to the above structure. For example, in the IC tray in Example 1, one first partition wall 11 may be formed between the row of the outermost seating portions 16 and the circumferential frame portion 13, and one second partition wall 12 may be formed between the row of the outermost seating portions 16 and the circumferential frame portion 13, as shown in FIGS. 10A and 10B. Otherwise, one first partition wall 11 may be formed between the row of the outermost seating portions 16 and the circumferential frame portion 13, and two second partition walls 12 may be formed between the row of the outermost seating portions 16 and the circumferential frame portion 13, as shown in FIGS. 10C and 10D, and opening portions 17 may be formed between the above two second partition walls 12. FIGS. 10A and 10C are cross-sectional views similar to that taken along line A—A in FIG. 1, and FIGS. 10B and 10D are cross-sectional views similar to that taken along a line C—C in FIG. 1. Further, the above variations can be applied to the IC tray explained in Example 2.

According to the present invention, the tray for semiconductor integrated circuit devices is provided with IC seating portions and opening portions surrounded by the partition walls, etc., and further, the above seating portions and the above opening portions are alternately disposed in the first direction or in the first and second directions. Accordingly, the propagation of a stress generated due to the heating of the IC tray to the entire IC tray can be prevented, and the twist deformation, caused on the IC tray during the baking treatment, can be effectively inhibited. Moreover, in a state where the IC trays are stacked in a multiple form during the baking treatment, the efficiency of conducting heat into the IC trays in the central positions can be remarkably improved, so that the time period for the baking treatment can be decreased and the ratio of defective products in the production of semiconductor integrated circuit devices can be decreased.

What is claimed is:

1. A tray for semiconductor integrated circuit devices, said tray comprising:

a plurality of first partition walls extending in a first direction; a plurality of second partition walls extending in a second direction at right angles with the first direction, wherein each of said second partition walls comprises a pair of walls; circumferential frame portions connecting end portions of said first and second partition walls; and a plurality of opening portions, wherein regions surrounded by said first partition walls and said second partition walls constitute seating portions for seating semiconductor integrated circuit devices, said first partition walls are disposed such that one of said first partition walls is disposed between two rows of the seating portions which are adjacent to each other in the second direction, said second partition walls are disposed such that one of said second partition walls is disposed between two rows of the seating portions which are adjacent to each other in the first direction, and each of said opening portions is formed in a region surrounded by one of the pairs of walls constituting one of said second partition walls, and two first partition walls.

2. The tray of claim 1, wherein an area of the opening portion is at least 1/20 as large as an area of the seating portion.

3. The tray of claim 1, wherein a ratio of an area of the opening portion to an area of a zone in which the opening portion is formed is at least 0.2.

4. The tray of claim 1, wherein said circumferential frame portions define a plurality of cut-out portions.

5. The tray of claim 1, wherein each of said seating portions is an imperforate structure that extends integrally from side surfaces of said first and second partition walls.

6. A tray for semiconductor integrated circuit devices, said tray comprising:

a plurality of first partition walls extending in a first direction; each of said first partition walls comprising a pair of partition walls; a plurality of second partition walls extending in a second direction at right angles with the first direction; each of said second partition walls comprising a pair of partition walls; circumferential frame portions connecting end portions of said first and second partition walls; a plurality of first opening portions; and a plurality of second opening portions, wherein regions surrounded by said first partition walls and said second partition walls constitute seating portions for seating semiconductor integrated circuit devices, said first partition walls are disposed such that one of said first partition walls is disposed between two rows of the seating portions which are adjacent to each other in the second direction, each of the first opening portions is formed in a region surrounded by one of the pairs of partition walls constituting one of said first partition walls, and two second partition walls, said second partition walls are disposed such that one of said second partition walls is disposed between two rows of the seating portions which are adjacent to each other in the first direction, and each of the second opening portions is formed in a region surrounded by one of the pairs of partition walls constituting one of said second partition walls, and two first partition walls.

7. The tray of claim 6, wherein an area of each of the first or second opening portions is at least 1/20 as large as an area of one of the seating portions.

8. The tray of claim 6, wherein a ratio of an area of the first or second opening portion to an area of a zone in which the first or second opening portion is formed is at least 0.2.

9. The tray of claim 6, wherein said circumferential frame portions define a plurality of cut-out portions.

10. The tray of claim 6, wherein each of said seating portions is an imperforate structure that extends integrally from side surfaces of said first and second partition walls.

* * * * *